United States Patent
Béraud-Sudreau et al.

(10) Patent No.: US 12,040,812 B2
(45) Date of Patent: Jul. 16, 2024

(54) METHOD FOR SYNCHRONISING ANALOGUE DATA AT THE OUTPUT OF A PLURALITY OF DIGITAL/ANALOGUE CONVERTERS

(71) Applicant: Teledyne e2v Semiconductors SAS, Saint-Egreve (FR)

(72) Inventors: Quentin Béraud-Sudreau, Rives (FR); Jérôme Ligozat, Grenoble (FR); Rémi Laube, Veurey-Voroize (FR); Marc Stackler, Hong Kong (CN)

(73) Assignee: Teledyne e2v Semiconductors SAS (FR)

( * ) Notice: Subject to any disclaimer, the term of this patent is extended or adjusted under 35 U.S.C. 154(b) by 61 days.

(21) Appl. No.: 17/636,820

(22) PCT Filed: Aug. 19, 2020

(86) PCT No.: PCT/EP2020/073161
§ 371 (c)(1),
(2) Date: Feb. 18, 2022

(87) PCT Pub. No.: WO2021/032767
PCT Pub. Date: Feb. 25, 2021

(65) Prior Publication Data
US 2022/0302922 A1  Sep. 22, 2022

(30) Foreign Application Priority Data
Aug. 20, 2019  (FR) ........................ 1909303

(51) Int. Cl.
*H03M 7/00* (2006.01)
*G11C 7/10* (2006.01)
(Continued)

(52) U.S. Cl.
CPC ......... *H03M 1/1255* (2013.01); *G11C 7/1036* (2013.01); *H03K 19/1774* (2013.01); *H03M 1/1215* (2013.01)

(58) Field of Classification Search
CPC .. H03M 1/1255; H03M 1/1215; H03M 1/662; H03M 1/0624; G11C 7/1036; H03K 19/1774
See application file for complete search history.

(56) References Cited

U.S. PATENT DOCUMENTS 7,978,109 B1   7/2011  Kuramochi
9,564,913 B1 * 2/2017  Courcy ................. H03L 7/0891
(Continued)

FOREIGN PATENT DOCUMENTS

EP  3 375 092        9/2018
WO  WO 2010/044838   4/2010

*Primary Examiner* — Jean B Jeanglaude
(74) *Attorney, Agent, or Firm* — Haynes and Boone, LLP

(57) ABSTRACT

A method for synchronizing analog data (Data_ana1, Data_ana2) at the output of a plurality of digital/analog converters (DAC), comprising at least one conversion core (C1, C2), on an active edge of a common reference clock (Clk), the method comprising the following steps: a) supplying an external synchronization signal (SYNC_ext), to at least one converter, and supplying a signal of the common reference clock to the plurality of converters; b) generating, within each converter, an internal synchronization signal (SYNC_int), such that all the internal synchronization signals are aligned on an active edge of the common reference clock; c) for each of the converters, generating a start signal (START1, START2) which represents the start of the sending of digital data and counting a number of clock strokes until the internal synchronization signal is generated, and; d) applying a delay Ri (R1, R2) to each converter core, the delay being equal to the difference between the highest number counted in step c) and the number counted for the core. Device for implementing such a method.

18 Claims, 3 Drawing Sheets

(51) Int. Cl.
*H03K 19/17736* (2020.01)
*H03M 1/12* (2006.01)

(56) References Cited

U.S. PATENT DOCUMENTS 9,847,787 B1 * 12/2017 Fry .................... H03M 1/0624
2003/0067354 A1    4/2003 Tsyrganovich

* cited by examiner

[Fig. 1]
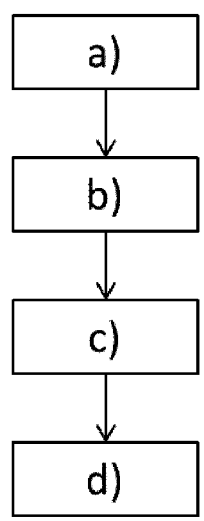

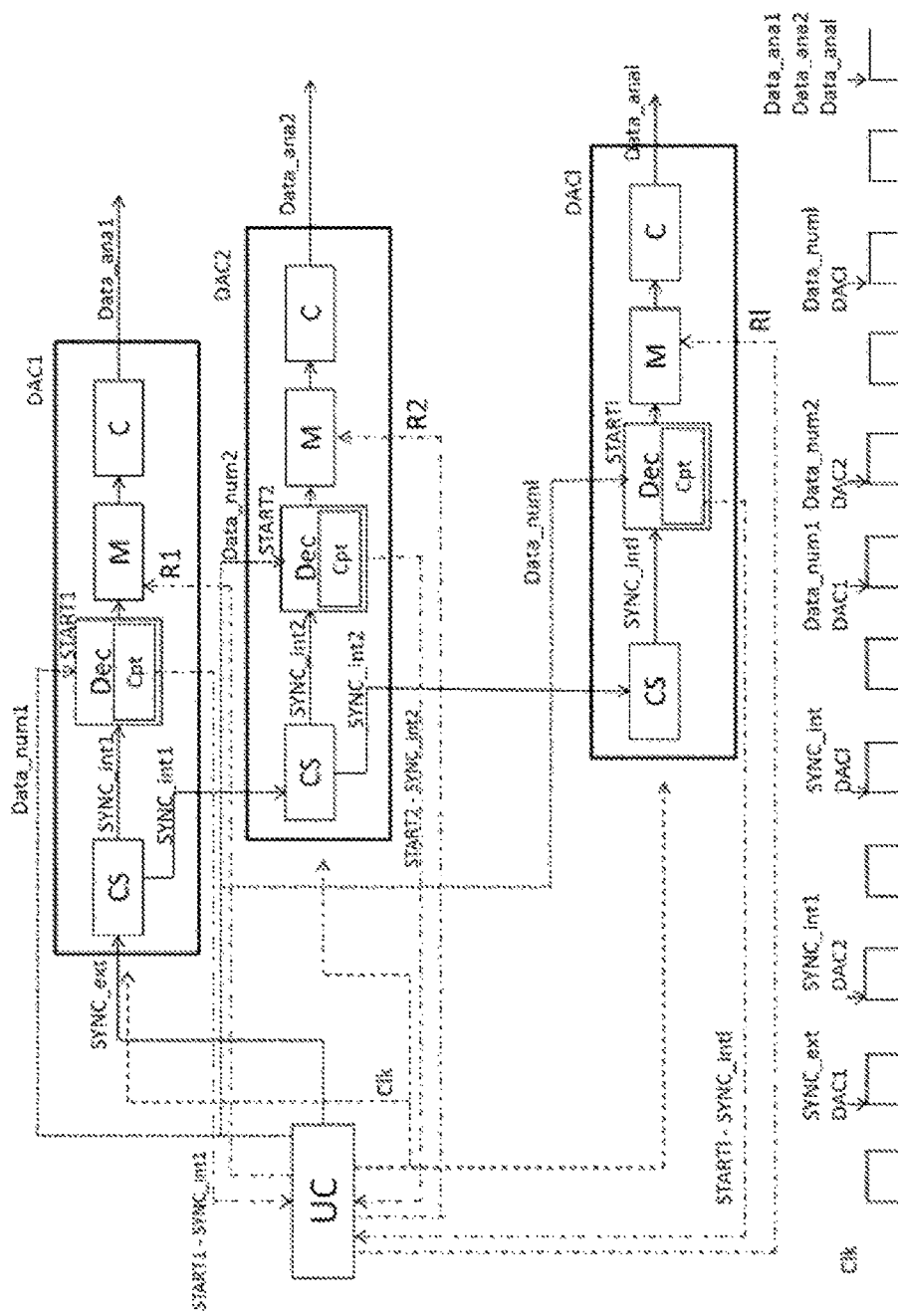
[Fig.2]

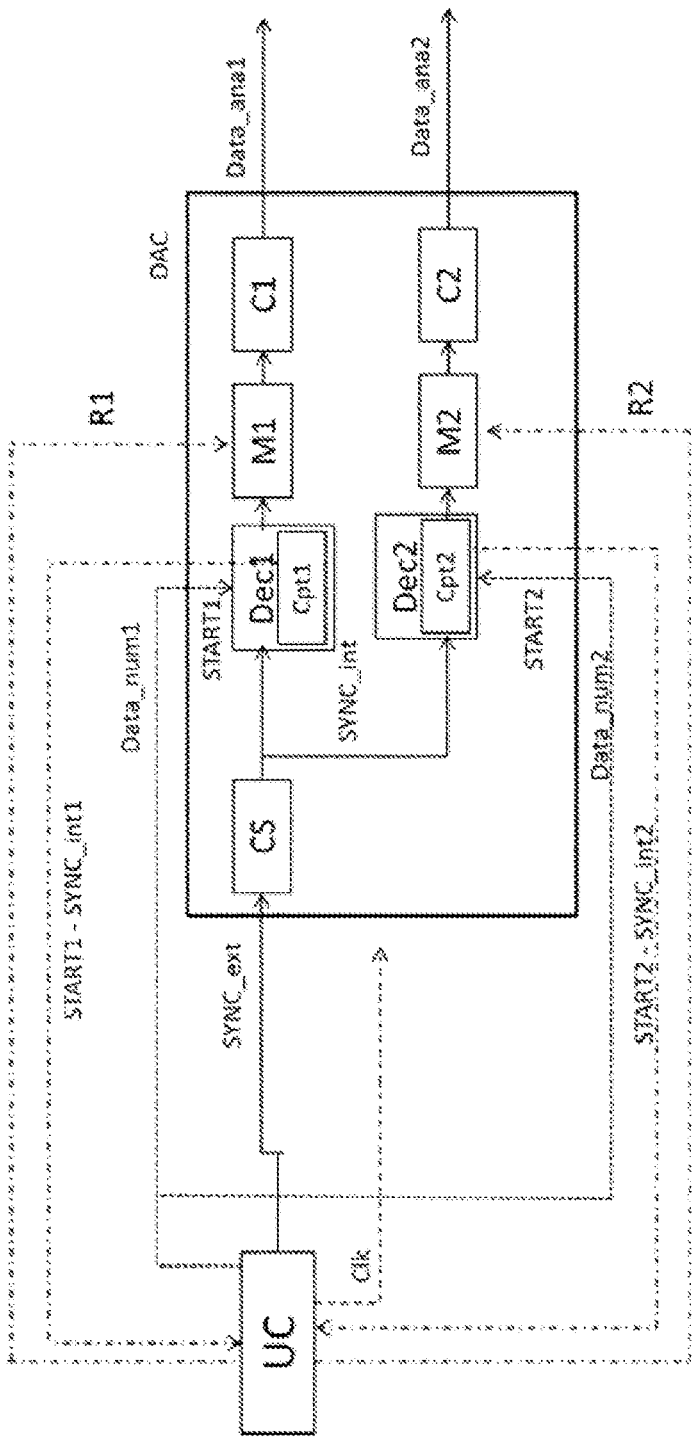
[Fig.3]

METHOD FOR SYNCHRONISING ANALOGUE DATA AT THE OUTPUT OF A PLURALITY OF DIGITAL/ANALOGUE CONVERTERS

CROSS-REFERENCE TO RELATED APPLICATIONS

This patent application is a U.S. National Stage Patent Application under 35 U.S.C. 371 of International Patent Application No. PCT/EP2020/073161 filed Aug. 19, 2020 and entitled "METHOD FOR SYNCHRONISING ANALOGUE DATA AT THE OUTPUT OF A PLURALITY OF DIGITAL/ANALOGUE CONVERTERS," which claims priority to French Patent Application No. 1909303 filed Aug. 20, 2019 and entitled "PROCÉDÉ DE SYNCHRONISATION DE DONNEES ANALOGIQUES EN SORTIE D'UNE PLURALITE DE CONVERTISSEURS NUMERIQUE/ANALOGIQUE," each of which is incorporated herein by reference in its entirety.

The present invention relates to a method for synchronizing analog data at the output of a plurality of digital/analog converters on the same active edge of a common reference clock. It also relates to a device for synchronizing analog data at the output of a plurality of digital/analog converters on an active edge of a common reference clock for implementing the method of the invention.

For some applications, such as matrix antennas or MIMO ("Multiple-Input, Multiple-Output") antennas, using a plurality of digital/analog converters and digital data entering in a serial link, it is necessary to synchronize the converters with one another.

To this end, a synchronization signal supplied to the converters makes it possible, firstly, to synchronize the internal clocks of the converters with one another. Given the high sampling frequency of the converters (from 1 to several Gigahertz), it is necessary for the synchronization signal to be very quick, that is of a few picoseconds, and for it to take place in a time window very much smaller than a clock period of the clocks of the converters.

Then, secondly, it is necessary to align the data arriving at the input of the converters with one another. However, the propagation times of the signals on the tracks of an electronic card are of the order of 6 ps/mm. In order for all the digital data provided at the input of the converters to arrive at the same time on all the converters, it is therefore necessary to adjust the length of the track transporting this data. For some applications, the physical distance between the components makes this track length alignment difficult, or even impossible.

In order to overcome this problem, various solutions exist for synchronizing converters, regardless of the lengths of the tracks to the different converters.

A first solution consists in sending a synchronization pulse in phase to all the converters, the distribution thereof being designed to obtain the propagation time adapted for each converter, in order for the active clock edges, on which the frequency dividers of the converters will be initialized, to match. That is to say that, pairwise, the active edges will all be distant by a period number of the reference clock which is a multiple of N: 0, N, 2N, . . . . Everything is determined by the design of the distribution paths of the reference clock and of the synchronization signal on each of the converters.

This requires precise evaluation of the propagation times on each of the converters. This first solution is quite simple to implement when the working frequencies are low, but when they are greater than 100 MHz it becomes increasingly difficult to evaluate the propagation times and to comply with the time constraints.

Other solutions modify the sampling clock, the effect of which is a degradation of the signal from this clock due to jitter problems, and therefore a degradation of the performance of the converters.

Some solutions use subdivisions of the sampling frequency and a master/slave system between the converters and the electronic circuit controlling the synchronization signal in order to produce the synchronization of the converters with one another. Nonetheless, they limit the temperature tolerance of the system, and complicate the management of the clocks in the system.

The aim of the invention is to overcome the abovementioned disadvantages of the prior art; more particularly, it aims to propose a solution making it possible to synchronize analog data at the output of digital/analog converters on the same active edge of the clock common to all the converters, the synchronization taking place inside the converters.

A subject matter of the invention is therefore a method for synchronizing analog data at the output of a plurality of digital/analog converters, comprising at least one conversion core, on an active edge of a common reference clock, characterized in that the method comprises the following steps:

a) Supplying an external synchronization signal, emitted by a control unit, to at least one converter of the plurality of converters, and supplying a clock signal of the common reference clock to the plurality of converters;

b) Generating, within each converter of the plurality of converters, an internal synchronization signal from the external synchronization signal, such that all the internal synchronization signals are aligned on an active edge of the common reference clock;

c) Generating, by means of at least one electronic circuit internal to each converter of the plurality of converters, a start signal which represents the start of the sending of digital data by the control unit, on each core of the plurality of converters, and counting a number of clock strokes between the generation of the start signal and the generation of the internal synchronization signal for each of the cores of the plurality of converters;

d) Applying a delay Ri to each core i of the plurality of converters, the delay being equal to the difference between the highest number counted in step c) and the number counted in step c) for the core i, i being an integer between 1 and the number of cores of the plurality of converters.

According to particular embodiments of such a method:

The internal synchronization signals can be generated in step b) by resampling the external synchronization signal.

The converters of the plurality of converters can form a serial transmission chain for the external synchronization signal, step a) also comprising:

initializing, in each converter of the plurality of converters, a synchronization circuit comprising at least one polarity parameter defining, as polarity of a reference clock edge, for detecting signals at the input of the synchronization circuit of the converters, the polarity of the reference clock active edge or the opposite polarity; and step b) also are comprising:

detecting a synchronization signal at the input of the synchronization circuits of each converter, on a reference clock edge, which has the polarity defined by the value of the polarity parameter of the synchronization circuit; and aligning, on the following active edge, the detected signal in order to supply an internal synchronization signal aligned on a reference clock active edge at the output of the synchronization circuit of the converter.

Another subject matter of the invention is a device for synchronizing analog data at the output of a plurality of digital/analog converters on an active edge of a common reference clock for implementing such a method, comprising:

a plurality of digital/analog converters comprising:
N conversion cores and
N memories,
each converter comprising at least one digital input, at least one analog output, at least one of the N memories, at least one of the N conversion cores and a synchronization circuit connected to the digital input, the synchronization circuits of the converters being connected to one another in a cascade, the memories of the converters each being connected to a conversion core of the converter and the synchronization circuit of the converters being configured so as to generate an internal synchronization signal and so that the internal synchronization signals generated are aligned on an active edge of a common clock, and N being an integer greater than or equal to 1; and a control unit configured so as to send a signal from the common reference clock, the external synchronization signal and digital data to each converter; characterized in that each converter also comprises a data decoding circuit, comprising a counter, for each conversion core included in the converter, the data decoding circuits being placed at the output of the synchronization circuit and at the input of the memories and being configured so as to generate the start signals which represent the start of the sending of digital data on a conversion core, and each counter being configured so as to count the number of clock strokes between the generation of the start signal and the generation of the internal synchronization signal for the conversion core, and in that the ith memory is configured so as to apply the delay Ri to the ith conversion core, i being an integer between 1 and N.

According to particular embodiments of such a device:

The control unit may comprise at least one programmable logic circuit configured to send the external synchronization signal.

The control unit may comprise at least one programmable logic circuit configured to send the digital data.

The control unit may also be configured to receive the number of clock strokes counted by the N counters, to determine the delays Ri and to supply, to the N memories, a delay value Ri to be applied to the ith conversion core.

The N memories may be shift registers.

The plurality of converters may comprise N converters, each converter comprising a single conversion core from the N conversion cores.

Other features, details and advantages of the invention will become clear from reading the description, made with reference to the appended figures given by way of example, which show, respectively:

FIG. 1, a diagram of the steps of the method according to the invention;

FIG. 2, a device making it possible to implement the method according to the invention; and FIG. 3, an example of a digital/analog converter having a plurality of conversion cores, making it possible to implement the method according to the invention.

FIG. 1 shows a diagram of the steps of the method according to the invention. The first step, step a), consists in supplying, to at least one converter of a plurality of digital/analog converters, an external synchronization signal SYNC_ext. The external synchronization signal SYNC_ext is emitted by a control unit UC controlling the plurality of converters.

The second step, step b), consists in generating, within each converter, an internal synchronization signal SYNC_int. These internal synchronization signals SYNC_int are synchronized with one another on an active edge of a common reference clock Clk.

The internal synchronization signals can be aligned outside the converters using delay lines, dedicated to the external synchronization signal SYNC_ext, between the control unit UC and the converters. In this case, all the converters directly receive, at the same time, the external synchronization signal SYNC_ext by virtue of the delay lines, and therefore the internal synchronization signals SYNC_int generated by the converters are synchronized on the same clock edge. In this case, the internal synchronization signal SYNC_int is generated directly within each converter from the external synchronization signal SYNC_ext.

This alignment may also occur, preferentially, inside the converters using the method described in French patent no. 1560739. This method consists in configuring the plurality of converters in a serial chain, and in replacing the phase distribution of the synchronization signal SYNC_ext on all the converters with a transmission of this external synchronization signal SYNC_ext from one converter to another in order to reach, from one to the next, all the converters in a chain. In other words, only the first converter directly receives the external synchronization signal SYNC_ext, then it generates an internal synchronization signal SYNC_int which it transmits to the next converter, which in turn generates an internal synchronization signal which is transmits in turn to the next converter, until the final converter in the chain is reached. In this case, the internal synchronization signal SYNC_int is generated indirectly within each converter from the external synchronization signal SYNC_ext, by transmission from one to the next.

This is carried out in combination with parameterization of each converter in the chain which reflects the propagation times of the synchronization signal SYNC_ext in this chain of converters and by means of which, at the output of each converter, an internal synchronization signal SYNC_int is transmitted, which is resynchronized for the following converter.

In the case of this method, the converters form a serial transmission chain for a synchronization signal, that is the converters each comprise a synchronization circuit connected in series to the other synchronization circuits of the converters of the plurality of converters. Moreover, step a) of the method also comprises initializing, in each converter of the plurality of converters, the synchronization circuit (CS, CS1, CS2, CSI) comprising at least one polarity parameter defining, as polarity of a reference clock edge, for detecting signals at the input of the synchronization circuit of the converters, the polarity of the reference clock active edge or the opposite polarity.

Step b) also comprises detecting a synchronization signal (SYNC_ext, SYNC_int1, SYNC_int2) arriving at the input of the synchronization circuits of each converter and originating from the synchronization circuit of the previous converter in the transmission chain (or from the control unit, for the first converter in the chain), on a reference clock edge, which has the polarity defined by the value of the polarity parameter of the synchronization circuit.

Step b) then comprises aligning, on the following active edge, the detected signal in order to supply an internal synchronization signal (SYNC_int1, SYNC_int2, SYNC_intI) aligned on a reference clock active edge at the output of the synchronization circuit of the converter.

In each converter, the parameterization also makes it possible to choose the correct reference clock edge which recovers the signal reinitializing the sampling clock generator, making it possible to phase synchronize the sampling clocks of all the converters.

Then, the third step of the method according to the invention, step c), consists in generating a start signal START which represents the start of the sending of digital data, by the control unit, to each core of the plurality of converters. This start signal START is a signal internal to each converter, emitted for each conversion core, indicating to all the converter cores that the next item of data received by the core is the first useful item of data, thus the first useful item of data to be converted. The start signal(s) are generated by the decoding block of the converter comprising one or more decoding circuits Dec depending on the number of conversion cores. This is described more specifically with reference to FIGS. 2 and 3.

This START signal is generated following the arrival of the very first useful item of data. In other words, as soon as the converter receives the first item of data of the serial link sent by the control unit, it generates the START signal.

Then, in this step c), the number of clock strokes between the generation of the start signal START and the generation of the internal synchronization signal SYNC_int for all the conversion cores is counted. This may be carried out by a counter Cpt present in each converter and for each conversion core within the converters.

Then, in the final step, step d), a delay Ri is applied to each core i of the plurality of converters, the delay being equal to the difference between the highest number counted in step c) and the number counted in step c) for the core i, i being an integer between 1 and the number of cores of the plurality of converters.

For example, three converters are considered, each having a single conversion core. The first converter counts 13 clock strokes between receiving the START signal and its internal synchronization signal SYNC_int, the second converter counts 17 clock strokes and finally the third converter counts 14 clock strokes. The highest number counted is 17, and therefore a delay RI equal to 17-13 will be applied to the first converter, i.e. a delay of 4 clock strokes. For the second converter, its delay R2 will be equal to 0, because it constitutes the reference, and finally, for the third converter, a delay R3 equal to 17-14 will be applied, i.e. a delay of 3 clock strokes.

If the converters comprise several conversion cores, the same principle is applied. The number of clock strokes between receiving the START signal and the internal synchronization signal SYNC_int is counted for each core of all the converters, then a delay equal to the difference between the highest number counted for all the cores and all the converters and the number counted for the core in question is applied to each core.

Applying a delay to each core thus makes it possible to synchronize all the cores on the slowest conversion core and thereby to obtain, at the output of the conversion cores, data converted and synchronized on the same active edge of the common reference clock.

FIG. 2 presents an example of a synchronization device making it possible to implement the method according to the invention, and to apply the method of French patent no. 1560739 for step b) of the method.

The device comprises a control unit UC and a plurality of digital/analog converters DAC1, DAC2, DACI. The control unit UC supplies, to at least one converter DAC1 of the plurality of converters DAC1, DAC2, DACI, an external synchronization signal SYNC_ext. It also supplies a clock signal from the common reference clock Clk and the digital data Data_num1, Data_num2, Data_numI transmitted in a serial link to the plurality of converters DAC1, DAC2, DACI.

As indicated in the figure, the receipt of the external synchronization signals SYNC_ext by DAC1 and internal synchronization signals SYNC_int1 by DAC2 and SYNC_int2 by DACI, making it possible to generate the internal synchronization signals SYNC_int1, SYNC_int2 and SYNC_intI according to the method of French patent no. 1560739, or digital data Data_num1, Data_num2, Data_numI on the converters, is not synchronized on the same active edge of the clock Clk.

Each converter DAC1, DAC2, DACI comprises, in this example, a synchronization circuit CS, a data decoding circuit Dec comprising a counter Cpt, a memory M and a conversion core C.

The synchronization circuits CS of the converters DAC1, DAC2 and DACI form a serial transmission chain. Thus, the synchronization circuit of the first converter DAC1 is connected to the control unit, and its output is connected to the input of the synchronization circuit of the second converter DAC2. The output of the circuit CS of the second converter DAC2 is connected to the input of the circuit CS of the third converter DACI.

The synchronization circuit CS will generate the internal synchronization circuit SYNC_int1, SYNC_int2, SYNC_intI within each converter DAC1, DAC2, DACI such that all the signals SYNC_int1, SYNC_int2, SYNC_intI of the converters are aligned on an active edge of the common clock Clk, which corresponds to executing step b) of the method according to the invention.

The data decoding circuit Dec receives the internal synchronization signal SYNC_int1 for the converter DAC1, SYNC_int2 for the converter DAC2 and SYNC_intI for the converter DACI from the synchronization circuit CS of the converter and the digital data sent by the control unit CS, Data_num1 on the converter DAC1, Data_num2 on the converter DAC2 and Data_numI on the converter DACI. Following the receipt of the digital data, this data decoding circuit Dec generates a START signal (START1 in the converter DAC1, START2 in the converter DAC2 and STARTI in the converter DACI) representing the receipt of the first item of digital data by the converter.

The device presented in this figure makes it possible to apply the method of French patent no. 1560739, therefore only the synchronization circuit CS of the converter DAC1 receives the external synchronization signal SYNC_ext emitted by the control unit UC. Then, the synchronization circuit CS of DAC1 generates an internal synchronization signal SYNC_int1 which is transmitted to the decoding circuit Dec of DAC1 and to the synchronization circuit CS of DAC2. The synchronization circuit CS of DAC2 then generates an internal synchronization signal SYNC_int2 which is transmitted to the decoding circuit Dec of DAC2 and to the synchronization circuit CS of DACI. The synchronization circuit CS of the final converter DACI generates an internal synchronization signal SYNC_int1 which is just transmitted to the decoding circuit Dec of the final converter DACI.

The counter Cpt present in the decoding circuits Dec is configured to count the number of clock strokes between the generation of the START signal and the generation of the internal synchronization signal SYNC_int by the decoding circuit Dec.

Therefore, the counter Cpt of the converter DAC1 counts the number of clock strokes between the START1 signal and the synchronization signal SYNC_int1, the counter Cpt of the converter DAC2 counts the number of clock strokes between the START2 signal and the synchronization signal SYNC_int2 and the counter Cpt of the converter DACI counts the number of clock strokes between the STARTI signal and the synchronization signal SYNC_int1.

The memory M is configured to apply a delay Ri to the transmission of the data to be converted between the data decoding circuit Dec and the conversion core C. This delay Ri is that described in step d) with reference to FIG. 1. It is therefore equal to the difference between the highest number of clock strokes counted by all the counters and the number of clock strokes counted for the converter comprising this memory.

In order to calculate this delay, the counter Cpt can send the number of clock strokes counted to the control unit UC which analyzes all the counts received in order to determine which is the slowest converter (in particular the conversion core), that is the conversion core supplying the analog data last from all the cores of the plurality of converters. Then, the control unit UC subsequently controls the delays Ri: R1, R2, RI applied by the different memories M.

Finally, the conversion core C is configured to carry out the conversion of the digital data Data_num1, Data_num2, Data_numI into analog data Data_ana1, Data_ana2, Data_anaI recovered at the output of the converter DAC1, DAC2, DACI. All the analog data Data_ana1, Data_ana2, Data_anaI at the output of the conversion cores C are then aligned in the same active edge of the clock Clk.

FIG. 3 presents another example of a device making it possible to implement the method according to the invention, and more particularly an example of a converter DAC having a plurality of conversion cores C1 and C2.

In the case of a converter having two conversion cores C1 and C2, the converter DAC comprises a synchronization circuit CS, two data decoding circuits Dec1 and Dec2, therefore two counters Cpt1 and Cpt2, and two memories M1 and M2. The synchronization circuit CS receives an external synchronization signal SYNC_ext originating from the control unit UC, then generates an internal synchronization signal SYNC_int which is transmitted to the two data decoding circuits Dec1 and Dec2.

The decoding circuits Dec1 and Dec2 are each connected to the same synchronization circuit CS, but are each connected to a memory and a core (M1 and C1 for the circuit Cpt1, and M2 and C2 for the circuit Cpt2).

The synchronization circuit CS can also receive a synchronization signal originating from another converter, if the converter DAC belongs to a plurality of converters, as described in FIG. 2.

Then, each of the data decoding circuits Dec1 and Dec2 receives digital data Data_num1 for Dec1 and Data_num2 for Dec2 from the control unit UC and therefore each generates a signal START1 and START2 representing the arrival of the first item of data to be converted on the conversion core C1 and C2.

The counter Cpt1 of the decoding circuit Dec1 then counts the number of clock strokes between the generation of the START1 signal and the generation of the SYNC_int signal, while the counter Cpt2 of the decoding circuit Dec2 counts the number of clock strokes between the generation of the START2 signal and that of the SYNC_int signal.

The control unit UC therefore receives, from the two counters Cpt1, Cpt2, the numbers of clock strokes counted, and can thus determine which is the slowest conversion core from the cores C1 and C2 of the converter, and more generally from all the conversion cores distributed in the converters. The slowest core will then be the reference for calculating the delay to be applied to the other conversion cores.

Next, the memories M1 and M2 are configured to apply a delay R1 and R2 and thereby synchronize the arrival of the data to be converted on each core on the slowest core.

The control unit UC can be produced by a programmable logic circuit of FPGA type. It is designed to control all the converters DAC1, DAC2, DACI and all the conversion cores C1, C2, according to a master/slave communication scheme, by means of a peripheral interface bus such as an SPI (Serial Peripheral Interface) bus, which is a commonly used synchronous serial data bus. The bus SPI enables the exchange of data between the control unit UC and the converters DAC1, DAC2, DACI and their cores C1, C2, in particular data which is the data to be converted.

The control unit UC can also comprise one or more programmable logic circuits of FPGA type. In the case of several circuits, one FPGA circuit may be dedicated to sending the digital data to the converters, while a second FPGA circuit may be dedicated to sending the external synchronization signal SYNC_ext. It is also possible to have dedicated FPGA circuits for sending the digital data, one circuit being dedicated to one converter.

The memories M present in the converters DAC, DAC1, DAC2, DACI may be shift registers, the register length of which is equal to the difference between the highest number of clock strokes counted from all the converter cores, and the number counted for the core linked to this register.

The invention claimed is:

1. A method for synchronizing analog data (Data_ana1, Data_ana2, Data_anaI) at an output of a plurality of digital/analog converters (DAC, DAC1, DAC2, DACI), comprising at least one conversion core (C, C1, C2), on an active edge of a common reference clock (Clk), characterized in that the method comprises the following steps:
   a) Supplying an external synchronization signal (SYNC_ext), emitted by a control unit (UC), to at least one converter of the plurality of converters, and supplying a clock signal of the common reference clock to the plurality of converters;
   b) Generating, within each converter of the plurality of converters, an internal synchronization signal (SYNC_int, SYNC_int1, SYNC_int2, SYNC_intI) from the external synchronization signal, such that all the internal synchronization signals are aligned on an active edge of the common reference clock;
   c) Generating, by means of at least one electronic circuit internal to each converter of the plurality of converters, a start signal (START1, START2, STARTI) which represents a start of sending of digital data (Data_num1, Data_num2, Data_numI) by the control unit, on each core of the plurality of converters, and counting a number of clock strokes between the generation of the start signal and the generation of the internal synchronization signal for each of the cores of the plurality of converters; and d) Applying a delay Ri (R1, R2, RI) to each core i of the plurality of converters, the delay being equal to the difference between the highest number counted in step c) and the number counted in step c) for the core i, i being an integer between 1 and the number of cores of the plurality of converters.

2. The method for synchronizing analog data according to claim 1, wherein the internal synchronization signals are generated in step b) by resampling the external synchronization signal.

3. The method for synchronizing analog data according to claim 1, wherein the converters of the plurality of converters form a serial transmission chain for the external synchronization signal, and step a) also comprises:

initializing, in each converter of the plurality of converters, a synchronization circuit (CS, CS1, CS2, CSI) comprising at least one polarity parameter defining, as polarity of a reference clock edge, for detecting signals at an input of the synchronization circuit of the converters, the polarity of the reference clock active edge or the opposite polarity; and Step b) also comprises:

detecting a synchronization signal (SYNC_ext, SYNC_int1, SYNC_int2) at the input of the synchronization circuits of each converter, on a reference clock edge, which has the polarity defined by a value of the polarity parameter of the synchronization circuit; and aligning, on the following active edge, the detected signal in order to supply an internal synchronization signal (SYNC_int1, SYNC_int2, SYNC_intI) aligned on a reference clock active edge at an output of the synchronization circuit of the converter.

4. A device for synchronizing analog data at an output of a plurality of digital/analog converters on an active edge of a common reference clock (Clk), the device comprising:

the plurality of digital/analog converters (DAC, DAC1, DAC2, DACI) comprising:

N conversion cores (C, C1, C2) and

N memories (M, M1, M2), each converter comprising at least one digital input, at least one analog output, at least one of the N memories, at least one of the N conversion cores and a synchronization circuit (CS, CS1, CS2, CSI) connected to the digital input, the synchronization circuits of the converters being connected to one another in a cascade, the memories of the converters each being connected to a conversion core of the converter and the synchronization circuit of the converters being configured so as to generate an internal synchronization signal (SYNC_int, SYNC_int1, SYNC_int2, SYNC_intI) and so that the internal synchronization signals generated are aligned on an active edge of a common clock, and N being an integer greater than or equal to 1; and a control unit (UC) configured so as to send a signal from the common reference clock (Clk), an external synchronization signal (SYNC_ext) and digital data (Data_num1, Data_num2, Data_numI) to each converter;

Characterized in that each converter also comprises a data decoding circuit (Dec1, Dec2, Dec), comprising a counter (Cpt, Cpt1, Cpt2), for each conversion core included in the converter, the data decoding circuits being placed at an output of the synchronization circuit and at an input of the memories and being configured so as to generate start signals (START1, START2, STARTI) which represent a start of the sending of the digital data on a conversion core, and each counter being configured so as to count a number of clock strokes between the generation of the start signal and the generation of the internal synchronization signal for the conversion core, and in that an ith memory is configured so as to apply a delay Ri (R1, R2, RI) to an ith conversion core, i being an integer between 1 and N.

5. The device for synchronizing analog data according to claim 4, wherein the control unit comprises at least one programmable logic circuit configured to send the external synchronization signal.

6. The device for synchronizing analog data according to claim 5, wherein the plurality of converters comprises N converters, each converter comprising a single conversion core from the N conversion cores.

7. The device for synchronizing analog data according to claim 4, wherein the control unit comprises at least one programmable logic circuit configured to send the digital data.

8. The device for synchronizing analog data according to claim 6, wherein the plurality of converters comprises N converters, each converter comprising a single conversion core from the N conversion cores.

9. The device for synchronizing analog data according to claim 8, wherein the plurality of converters comprises N converters, each converter comprising a single conversion core from the N conversion cores.

10. The device for synchronizing analog data according to claim 5, wherein the control unit comprises at least one programmable logic circuit configured to send the digital data.

11. The device for synchronizing analog data according to claim 7, wherein the plurality of converters comprises N converters, each converter comprising a single conversion core from the N conversion cores.

12. The device for synchronizing analog data according to claim 7, wherein the control unit is also configured to receive the number of clock strokes counted by the N counters, to determine the delays Ri and to supply, to the N memories, a delay value Ri to be applied to the ith conversion core.

13. The device for synchronizing analog data according to claim 7, wherein the N memories are shift registers.

14. The device for synchronizing analog data according to claim 4, wherein the control unit is also configured to receive the number of clock strokes counted by the N counters, to determine the delays Ri and to supply, to the N memories, a delay value Ri to be applied to the ith conversion core.

15. The device for synchronizing analog data according to claim 14, wherein the N memories are shift registers.

16. The device for synchronizing analog data according to claim 4, wherein the N memories are shift registers.

17. The device for synchronizing analog data according to claim 16, wherein the plurality of converters comprises N converters, each converter comprising a single conversion core from the N conversion cores.

18. The device for synchronizing analog data according to claim 4, wherein the plurality of converters comprises N converters, each converter comprising a single conversion core from the N conversion cores.

* * * * *

UNITED STATES PATENT AND TRADEMARK OFFICE
CERTIFICATE OF CORRECTION

| | |
|---|---|
| PATENT NO. | : 12,040,812 B2 |
| APPLICATION NO. | : 17/636820 |
| DATED | : July 16, 2024 |
| INVENTOR(S) | : Quentin Beraud-Sudreau et al. |

Page 1 of 1

It is certified that error appears in the above-identified patent and that said Letters Patent is hereby corrected as shown below:

In the Specification

In the Cross-Reference to Related Applications:

Column 5, Line 9, change "SYNC_int1) aligned on a reference" to --SYNC_intl) aligned on a reference--.

Column 6, Line 14, change "Data_num1 transmitted in a serial link" to --Data_numl transmitted in a serial link--.

Column 6, Line 22, change "and SYNC-int1 according to the method" to --and SYNC_intl according to the method--.

Column 6, Line 24, change "Data_num1 on the converters, is not" to --Data_numl on the converters, is not--.

Column 6, Line 40, change "SYNC_int1 within each converter" to --SYNC_intl within each converter--.

Column 6, Line 42, change "SYNC_int1 of the converters are aligned" to --SYNC_intl of the converters are aligned--.

Column 6, Line 46, change "SYNC_int1 for the converter DAC1," to --SYNC_intl for the converter DAC1--.

Column 6, Line 50, change "Data_num1 on the converter DAC1," to --Data_numl on the converter DAC1--.

Signed and Sealed this
Twenty-fourth Day of September, 2024

Katherine Kelly Vidal
*Director of the United States Patent and Trademark Office*